United States Patent
Xu et al.

(10) Patent No.: US 8,569,730 B2
(45) Date of Patent: Oct. 29, 2013

(54) CARBON-BASED INTERFACE LAYER FOR A MEMORY DEVICE AND METHODS OF FORMING THE SAME

(75) Inventors: Huiwen Xu, Sunnyvale, CA (US); April D. Schricker, Palo Alto, CA (US); Er-Xuan Ping, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 204 days.

(21) Appl. No.: 12/465,315

(22) Filed: May 13, 2009

(65) Prior Publication Data

US 2010/0006811 A1 Jan. 14, 2010

Related U.S. Application Data

(60) Provisional application No. 61/078,911, filed on Jul. 8, 2008, provisional application No. 61/078,924, filed on Jul. 8, 2008.

(51) Int. Cl.
*H01L 47/00* (2006.01)
(52) U.S. Cl.
USPC .... 257/4; 257/2; 257/E47.001; 257/E47.005; 977/742
(58) Field of Classification Search
USPC .......................................... 257/2, 4; 977/742
See application file for complete search history.

(56) References Cited

U.S. PATENT DOCUMENTS

| | | | |
|---|---|---|---|
| 5,629,666 A | 5/1997 | Imai et al. | |
| 5,915,167 A | 6/1999 | Leedy | |
| 6,333,016 B1 | 12/2001 | Resasco et al. | |
| 6,420,092 B1 | 7/2002 | Yang | |
| 6,515,325 B1 | 2/2003 | Farnworth et al. | |
| 6,706,402 B2 | 3/2004 | Rueckes | |
| 6,833,558 B2 | 12/2004 | Lee et al. | |
| 6,863,942 B2 | 3/2005 | Ren et al. | |
| 6,885,021 B2 | 4/2005 | Apodaca et al. | |
| 6,919,592 B2 | 7/2005 | Segal et al. | |
| 6,952,030 B2 | 10/2005 | Herner et al. | |
| 6,969,651 B1 | 11/2005 | Lu et al. | |
| 6,986,877 B2 | 1/2006 | Takikawa et al. | |
| 7,056,758 B2 | 6/2006 | Segal et al. | |
| 7,084,062 B1 | 8/2006 | Avanzino et al. | |
| 7,176,064 B2 | 2/2007 | Herner | |
| 7,224,033 B2 | 5/2007 | Zhu et al. | |
| 7,285,464 B2 | 10/2007 | Herner et al. | |

(Continued)

FOREIGN PATENT DOCUMENTS

EP 1 361 608 11/2003
EP 1 739 753 1/2007

(Continued)

OTHER PUBLICATIONS

Ping et al., U.S. Appl. No. 12/608,607, filed Oct. 29, 2009.

(Continued)

*Primary Examiner* — A. Sefer
(74) *Attorney, Agent, or Firm* — Dugan & Dugan, PC

(57) ABSTRACT

In a first aspect, a memory cell is provided that includes (1) a first conductor; (2) a reversible resistance-switching element formed above the first conductor including (a) a carbon-based resistivity switching material; and (b) a carbon-based interface layer coupled to the carbon-based resistivity switching material; (3) a steering element formed above the first conductor; and (4) a second conductor formed above the reversible resistance-switching element and the steering element. Numerous other aspects are provided.

8 Claims, 4 Drawing Sheets

(56) References Cited

U.S. PATENT DOCUMENTS

| | | |
|---|---|---|
| 7,301,191 B1 | 11/2007 | Tombler et al. |
| 7,345,296 B2 | 3/2008 | Tombler, Jr. et al. |
| 7,374,987 B2 | 5/2008 | Chidambarrao et al. |
| 7,483,285 B2 | 1/2009 | Furukawa et al. |
| 7,560,136 B2 | 7/2009 | Ward et al. |
| 7,575,984 B2 | 8/2009 | Radigan |
| 7,615,432 B2 | 11/2009 | Kim et al. |
| 7,618,300 B2 | 11/2009 | Liu et al. |
| 7,768,016 B2 | 8/2010 | Kreupl |
| 2003/0021966 A1 | 1/2003 | Segal et al. |
| 2003/0073295 A1 | 4/2003 | Xu |
| 2003/0222560 A1 | 12/2003 | Roach |
| 2004/0159835 A1* | 8/2004 | Krieger et al. ............ 257/40 |
| 2005/0019494 A1 | 1/2005 | Moghadam et al. |
| 2005/0052915 A1 | 3/2005 | Herner et al. |
| 2005/0148271 A1 | 7/2005 | Yaniv et al. |
| 2005/0226067 A1 | 10/2005 | Herner et al. |
| 2006/0038212 A1 | 2/2006 | Moore et al. |
| 2006/0097342 A1 | 5/2006 | Parkinson |
| 2006/0234418 A1 | 10/2006 | Ufert |
| 2006/0250836 A1 | 11/2006 | Herner |
| 2006/0269692 A1 | 11/2006 | Balseanu et al. |
| 2007/0020919 A1 | 1/2007 | Adem et al. |
| 2007/0122621 A1* | 5/2007 | Kreupl et al. ............ 428/408 |
| 2007/0128858 A1 | 6/2007 | Haukka |
| 2007/0190722 A1 | 8/2007 | Herner |
| 2007/0200243 A1 | 8/2007 | Kraus et al. |
| 2007/0221998 A1 | 9/2007 | Park |
| 2007/0252131 A1 | 11/2007 | Tong et al. |
| 2007/0268042 A1* | 11/2007 | Paul ......................... 326/45 |
| 2007/0269992 A1 | 11/2007 | Yang et al. |
| 2008/0026523 A1 | 1/2008 | Lee et al. |
| 2008/0061283 A1 | 3/2008 | Taguchi |
| 2008/0070162 A1* | 3/2008 | Ufert ........................ 430/290 |
| 2008/0099752 A1* | 5/2008 | Kreupl et al. .............. 257/2 |
| 2008/0101121 A1 | 5/2008 | Kreupl |
| 2008/0107892 A1 | 5/2008 | Jiao et al. |
| 2008/0135834 A1 | 6/2008 | Kaza et al. |
| 2008/0173858 A1 | 7/2008 | An et al. |
| 2008/0210923 A1 | 9/2008 | Sato |
| 2008/0230826 A1 | 9/2008 | Das |
| 2008/0233396 A1 | 9/2008 | Raravikar |
| 2008/0237599 A1 | 10/2008 | Herner et al. |
| 2008/0237733 A1 | 10/2008 | Chen et al. |
| 2008/0239790 A1 | 10/2008 | Herner |
| 2008/0308785 A1 | 12/2008 | Park et al. |
| 2009/0017640 A1 | 1/2009 | Huh et al. |
| 2009/0166609 A1 | 7/2009 | Schricker |
| 2009/0166610 A1 | 7/2009 | Schricker |
| 2009/0168491 A1 | 7/2009 | Schricker |
| 2009/0213643 A1 | 8/2009 | Angerbauer et al. |
| 2009/0225588 A1 | 9/2009 | Czubatyj et al. |
| 2009/0256132 A1 | 10/2009 | Scheuerlein |
| 2009/0263972 A1 | 10/2009 | Balseanu et al. |
| 2009/0278112 A1 | 11/2009 | Schricker et al. |
| 2009/0283735 A1 | 11/2009 | Li et al. |
| 2010/0001267 A1 | 1/2010 | Manning et al. |
| 2010/0006812 A1 | 1/2010 | Xu |
| 2010/0008122 A1 | 1/2010 | Tilke |
| 2010/0012912 A1 | 1/2010 | Schricker |
| 2010/0019317 A1 | 1/2010 | Moroz et al. |
| 2010/0032638 A1 | 2/2010 | Xu |
| 2010/0032643 A1 | 2/2010 | Xu |
| 2010/0078759 A1 | 4/2010 | Sekar et al. |
| 2010/0102291 A1 | 4/2010 | Xu |
| 2010/0117041 A1* | 5/2010 | Hwang et al. .............. 257/2 |
| 2010/0245029 A1 | 9/2010 | Schricker et al. |
| 2011/0254126 A1 | 10/2011 | Kreupl et al. |
| 2012/0168707 A1 | 7/2012 | Li et al. |

FOREIGN PATENT DOCUMENTS

| | | |
|---|---|---|
| EP | 1 892 722 | 2/2008 |
| EP | 1 916 722 | 4/2008 |
| JP | 2006/063369 | 3/2006 |
| WO | WO 2004/070735 | 8/2004 |
| WO | WO 2005/045871 | 5/2005 |
| WO | WO 2006/049834 A1 | 5/2006 |
| WO | WO 2006/078505 A2 | 7/2006 |
| WO | WO 2006/079979 | 8/2006 |
| WO | WO 2007/130913 A2 | 11/2007 |
| WO | WO 2008/021900 | 2/2008 |
| WO | WO 2008/036385 | 3/2008 |
| WO | WO 2009/088889 A | 7/2009 |
| WO | WO 2009/088890 A | 7/2009 |
| WO | WO 2009/137222 | 11/2009 |
| WO | WO 2010/017427 A1 | 2/2010 |
| WO | WO 2010/048408 A2 | 4/2010 |

OTHER PUBLICATIONS

Jayasekara, U.S. Appl. No. 12/608,592, filed Oct. 29, 2009.

Budnik et al., "A High Density, Carbon Nanotube Capacitor for Decoupling Applications", DAC 2006, Jul. 24-28, 2006, pp. 935-938.

Engelsen, "The temptation of field emission displays", Physics Procedia 1 (2008), pp. 355-365.

Leroy et al., "Thin film solid-state reactions forming carbides as contact materials for carbon-containing semiconductors", Journal of Applied Physics, vol. 101, No. 5, (2007) pp. 053714-1-053714-10.

Grill, "Plasma-deposited Diamondlike Carbon and Related Materials", Jan./Mar. 1999; IBM J. Res. Develop. vol. 43 No. 1/2, pp. 147-162.

Xu, U.S. Appl. No. 12/780,564, filed May 14, 2010.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Bhattacharyya, et al., "Switching behaviour and high frequency response of amorphous carbon double-barrier structures" Aug. 2007, Materials Science and Engineering C, Elsevier Science S.A, CH, vol. 27 No. 5-8, pp. 957-960.

Dittmer et al., "Low ambient temperature CVD growth of carbon nanotubes," Appl. Phys. A 84, 2006, p. 1.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

International Search Report & Written Opinion of International Patent Application No. PCT/US2009/049463 mailed Sep. 17, 2009.

Jayasekara et al., U.S. Appl. No. 12/408,419, filed Mar. 20, 2009.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.

Kong et al., "Integration of a gate electrode into carbon nanotube devices for scanning tunneling microscopy," Appl. Phys. Lett. 86, 2005, pp. 112106-1-112106-3.

Schricker et al., U.S. Appl. No. 12/421,405, filed Apr. 9, 2009.

Takai et al.,"Structure and Electronic Properties of a Nongraphitic Disordered Carbon System and its Heat-Treatment Effects", 2003, Physical Review B 67, 214202, pp. 214202-1-214202-11.

Xu, U.S. Appl. No. 12/536,457, filed Aug. 5, 2009.

Murarka, S.P., et al. "Effect of Growth Parameters on the CVD of Boron Nitride and Phosphorus-Doped Boron Nitride." J. Electrochem. Soc.:Sol.-State Sci. & Technol., vol. 126, No. 11 (1979) pp. 1951-1957.

\* cited by examiner ical memories formed from reversible resistance-switching elements are known. For example, U.S. patent

CARBON-BASED INTERFACE LAYER FOR A MEMORY DEVICE AND METHODS OF FORMING THE SAME

CROSS REFERENCE TO RELATED APPLICATIONS

This application claims priority from U.S. Provisional Patent Application Ser. No. 61/078,911, filed 8 Jul. 2008, and titled "CARBON-BASED INTERFACE LAYER FOR A MEMORY DEVICE AND METHODS OF FORMING THE SAME," which is hereby incorporated by reference herein in its entirety for all purposes.

This application is related to U.S. Provisional Patent Application Ser. No. 61/044,352, filed 11 Apr. 2008, and titled "DAMASCENE INTEGRATION METHODS FOR GRAPHITIC FILMS IN THREE-DIMENSIONAL MEMORIES AND MEMORIES FORMED THEREFROM," which is hereby incorporated by reference herein in its entirety for all purposes.

The present application is related to the following commonly assigned U.S. Patent Applications U.S. Provisional Patent Application Ser. No. 61/078,924, filed 8 Jul. 2008 and titled "CARBON-BASED RESISTIVITY-SWITCHING MATERIALS AND METHODS OF FORMING THE SAME" which is hereby incorporated by reference herein in its entirety for all purposes.

FIELD OF THE INVENTION

The present invention relates generally to carbon-based materials for use in semiconductor devices and relates more particularly to carbon-based interface materials and processes.

BACKGROUND

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL", which is hereby incorporated by reference herein in its entirety for all purposes, describes a three-dimensional, rewriteable non-volatile memory cell that includes a diode coupled in series with a reversible resistivity-switching material such as a metal oxide or metal nitride.

It is also known that certain carbon-based films may exhibit reversible resistivity-switching properties, making such films candidates for integration within a three-dimensional memory array. However, integrating carbon-based resistivity-switching materials in memory devices is difficult; and improved methods of forming memory devices that employ carbon-based reversible resistivity-switching materials are desirable.

SUMMARY

In some embodiments of the invention, a memory cell is provided that includes (1) a first conductor; (2) a reversible resistance-switching element formed above the first conductor including (a) a carbon-based resistivity switching material; and (b) a carbon-based interface layer coupled to the carbon-based resistivity switching material; (3) a steering element formed above the first conductor; and (4) a second conductor formed above the reversible resistance-switching element and the steering element.

In other embodiments of the invention, an apparatus is provided that includes (1) a carbon-based interface layer; and (2) a carbon-based resistivity switching material adjacent the carbon-based interface layer. The carbon-based interface layer is denser than the carbon-based resistivity switching material.

In other embodiments of the invention, an apparatus is provided that includes (1) a first carbon-based interface layer; and (2) a carbon-based resistivity switching material adjacent the first carbon-based interface layer. The first carbon-based interface layer comprises nitridized carbon-based material.

In yet other embodiments of the invention, a method of forming a memory cell is provided that includes (1) forming a first conductor above a substrate; (2) forming a carbon-based interface layer above the first conductor; (3) forming a carbon-based resistivity switching material adjacent the carbon-based interface layer; and (4) forming a second conductor above the carbon-based interface layer and the carbon-based resistivity switching material. Numerous other aspects are provided.

Other features and aspects of this invention will become more fully apparent from the following detailed description, the appended claims and the accompanying drawings.

BRIEF DESCRIPTION OF THE DRAWINGS

A more particular understanding of the invention may be obtained by reference to the described embodiments thereof that are illustrated in the appended drawings. The appended drawings illustrate only typical embodiments of this invention, they are not intended to be scale, and they are not to be considered limiting of its scope, for the invention may admit to other effective embodiments.

To facilitate understanding, similar reference numerals have been used, where possible, to designate similar elements that are common to the figures.

DETAILED DESCRIPTION

Figure 1:
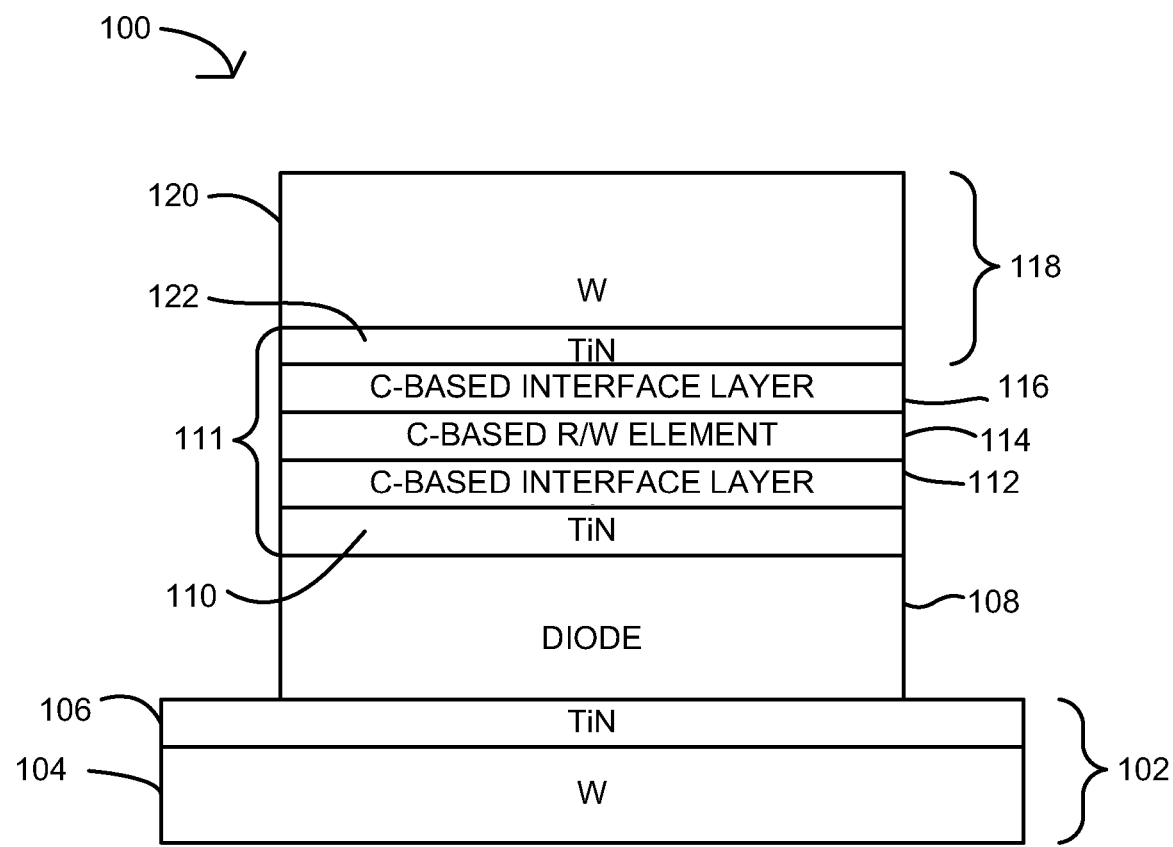
FIG. 1 is a cross-sectional side elevational representation of a device in accordance with an embodiment of the present invention.

Certain carbon-based films, including but not limited to amorphous carbon containing microcrystalline or other regions of graphene, graphene, carbon nanotubes (CNTs), other graphitic carbon films, etc., may exhibit reversible resistivity-switching properties, making such films candidates for integration within a three-dimensional memory array. However, a challenge to the successful use of carbon-based resistivity-switching ("C-based switching") materials as reversible resistance-switchable elements is the delamination and/or peeling that may occur between a C-based switching material and an adjacent film (such as TiN, WN, W, etc). Another difficulty is that an adjacent film may undesirably penetrate a porous C-based switching material such as a CNT layer (e.g., creating a short circuit across the C-based switching material).

The present invention provides C-based interface layers that improve adhesion between C-based switching materials and other films that may be employed in a non-volatile memory array. In addition to serving as adhesion layers, in some embodiments, such C-based interface layers may function as capping layers to seal porous C-based switching materials (e.g., CNT switching materials).

C-based materials, such as amorphous carbon films, exhibit primarily two bonding structures, $sp^2$ and $sp^3$. An $sp^3$ bonding structure has a tetrahedral shape that is more conducive to bonding with other material layers than a more planar, trigonal $sp^2$ bonding structure. As such, in some embodiments of the invention, a C-based interface layer is provided with an increased $sp^3$ bond concentration (relative to the C-based switching material to which it serves as an interface layer). For example, an $sp^3$-rich C-based interface layer may be employed between a conductive layer, such as TiN, TaN, W, WN, Mo, etc., and a C-based switching material to improve adhesion between the C-based switching material and the conductive layer.

As described further below, in some embodiments, both C-based switching materials and C-based interface layers may be formed using plasma-enhanced chemical vapor deposition (PECVD). To form a C-based interface layer, process temperature may be lowered and/or plasma ionization may be increased during film formation to increase the $sp^3$ concentration of the resultant film. Other C-based switching and/or adhesion material formation processes may be used (e.g., thermal CVD, low pressure CVD, subatmospheric CVD, etc.).

Increasing the density of a C-based film has also been found to improve adhesion of the film to other materials such as conductive layers. In some embodiments, a C-based interface layer is formed with an increased density relative to the C-based switching material to which the C-based interface layer is coupled. As described further below, reducing deposition rate during C-based layer formation may increase layer density, by increasing surface ion bombardment during layer formation. Reduction of the deposition rate of a C-based interface layer may occur due to dilution of the precursors used during C-based interface layer formation and/or increased ion bombardment with helium, argon, xenon, krypton or another inert species.

Ion bombardment may be increased, for example, by increasing carrier gas concentration (e.g., argon, helium, krypton, xenon or another inert gas concentration) so as to generate more ionic species. Additionally or alternatively, a substrate bias and/or low frequency RF may be employed to increase ion bombardment. High frequency RF power may also be increased. Note that reducing process temperature to increase $sp^3$ concentration may decrease film density. Accordingly, reducing deposition rate and/or increasing surface ion bombardment may be employed to increase film density to compensate for reduced process temperatures used to increase $sp^3$ concentration.

In another embodiment of the invention, adhesion between a C-based switching layer and another layer (e.g., a conductive or dielectric layer) may be improved with a C-based interface layer formed by nitridizing a C-based material layer. A portion of a C-based switching layer itself may be nitridized to form the C-based interface layer, or a separate C-based material layer adjacent the C-based switching layer may be nitridized to form the C-based interface layer. For example, a C-based material layer may be nitridized by exposing the C-based material layer to $N_2$, or any other N-containing gas ($NH_3$, $N_2O$ or the like) at an elevated temperature, by plasma nitridizing in a PECVD chamber, or the like (described below). Similarly, to improve the adhesion of a C-based switching layer with an underlying metal layer, the underlying metal layer may be nitridized using $N_2$, or any other N-containing gas, before deposition of C-based material over the metal layer.

In one or more embodiments of the invention, the above described C-based interface layers may also serve as capping layers for porous C-based switching materials. For example, a deposited or grown CNT material layer typically has a rough surface topography, with pronounced thickness variations, such as numerous peaks and valleys. Such a CNT layer may also be very porous, so much so that depositing a conductive layer directly on the CNT layer may create a short circuit through the entire CNT layer. In some embodiments, it has been observed that metal deposits directly into the CNT hole, which may form a pore in the CNT film. In other embodiments, metal may migrate through the CNT film, between the CNTs, possibly during higher energy or temperature processing used for device fabrication.

To overcome such potential issues, in one or more embodiments of the invention, a C-based interface layer, such as amorphous carbon, may be formed over a porous C-based switching material to cap the porous C-based switching material prior to formation of a conductive layer over the C-based switching material. Such a C-based interface (capping) layer may be dense and stable during subsequent thermal processes (e.g., migration/diffusion of carbon or other materials through the C-based interface/capping layer and/or the porous C-based switching layer due to subsequent thermal processing is minimal). Unlike some metal layers, the C-based interface/capping layer will not react with and/or otherwise adversely affect the porous C-based switching layer (e.g., a CNT layer). Such a C-based interface/capping layer may also improve adhesion between the C-based switching material and the conductive layer. Any of the previously described C-based interface layers may serve as such a capping layer.

Exemplary Device Structures

In some embodiments of the invention, thin C-based films may be integrated in series with a steering element such as a (vertical) diode or a thin film transistor (TFT) to create a re-writable memory device. To achieve this, a carbon-based switching material, such as an amorphous carbon film containing microcrystalline graphene, a carbon nanotube film, another graphitic carbon film, or the like, may be formed between two metal layers or other conductors in a metal-insulator-metal (MIM) planar stack. Such an MIM stack may be placed in series with a (vertical) diode or other steering element to create a re-writable memory device.

FIG. 1 is a cross-sectional view of an exemplary memory cell 100 formed in accordance with the present invention. With reference to FIG. 1, a first rail conductor 102 is formed above a substrate (not shown). For example, the first conductor 102 may include a tungsten layer or other conductive layer 104 with or without a TiN, TaN, WN, or other adhesion/barrier layer 106. A vertical P-I-N or N-I-P diode 108, such as a deposited polysilicon or other polycrystalline semiconductor diode, is formed above first rail conductor 102. A TiN, WN, TaN or other adhesion/barrier layer 110 is formed above the diode 108. The adhesion/barrier layer 110 may serve as a bottom electrode of a metal-insulator-metal (MIM) stack 111.

In some embodiments, a silicide region (not shown) is formed in contact with the diode 108. As described in U.S. Pat. No. 7,176,064, "MEMORY CELL COMPRISING A SEMICONDUCTOR JUNCTION DIODE CRYSTALLIZED ADJACENT TO A SILICIDE," which is hereby incorporated by reference herein in its entirety for all purposes, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., a silicide layer may enhance the crystalline structure of the diode 108 during annealing). Lower resistivity silicon thereby is provided. Similar results may be achieved for silicon-germanium alloy and/or germanium diodes.

In some embodiments, a metal hard mask (not shown) is formed above the diode 108. Use of metal hard masks is described, for example, in U.S. patent application Ser. No. 11/444,936, filed 13 May, 2006 and titled "CONDUCTIVE HARD MASK TO PROTECT PATTERNED FEATURES DURING TRENCH ETCH" (hereinafter "the '936 Application"), which is hereby incorporated by reference herein in its entirety for all purposes.

In one embodiment, a first C-based interface layer 112 in accordance with the present invention is formed over the adhesion/barrier layer 110 to improve adhesion between the adhesion/barrier layer 110 and a C-based switching material to be formed (described below). The first C-based interface layer 112 may have one or more of an increased $sp^3$ bond concentration, an increased density, a nitridized region or the like as described previously.

A C-based switching material 114 such as graphene, amorphous carbon containing microcrystalline graphene, carbon nanotubes (CNTs), other graphitic carbon, etc., is formed above the first C-based interfacial layer 112. The C-based switching material 114 may be deposited and/or grown by any suitable technique such as Chemical Vapor Deposition (CVD), High Density Plasma (HDP) deposition, plasma enhanced CVD, sputter deposition from an amorphous or graphite target, a spin on process, seeded growth, etc. In some embodiments, post deposition treatment(s) may be employed such as annealing in reduced pressure or oxygen environments to affect or otherwise improve the properties of the C-based switching material 114.

A second C-based interface layer 116 in accordance with the present invention is formed above C-based switching material 114. The second C-based interface layer 116 may be the same as or different from the first C-based interface layer 112. The first C-based interface layer 112, the C-based switching material 114, and the second C-based interface layer 116 may serve as an insulating portion of MIM stack 111.

Thereafter, a top conductor 118 is formed above the upper C-based interface layer 116. For example, the top conductor 118 may include a tungsten layer or other conductive layer 120 with or without a TiN, WN, TaN or other adhesion/barrier layer 122. A portion of the top conductor 118, such as the adhesion/barrier layer 122, may serve as a top electrode of the MIM stack 111. Note that in some embodiments, the diode 108 may be positioned above the C-based switching material 114.

The conductive layers 104, 120 may comprise, for example, about 200 to about 2500 angstroms of tungsten. Other conductive layer materials and/or thicknesses may be used. The adhesion layers 106, 110, 122 may comprise, for example, about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. Exemplary widths for the conductors 102, 118 and/or spacings between the conductors range from about 200 to about 2500 angstroms, although other conductor widths and/or spacings may be used.

In one or more embodiments, the first C-based interface layer 112 and/or the second C-based interface layer 116 may have a thickness of about 2 to about 500 angstroms, more preferably about 2 to about 50 angstroms and still more preferably about 10 to about 20 angstroms. The C-based switching material 114 may have a thickness of about 1 to about 2000 angstroms, and more preferably about 2 to about 1000 angstroms. Other thicknesses ranges may be used for these layers.

In some embodiments, the C-based switching material 114 may be deposited at a low rate so that just a few atomic layers are deposited (e.g., approximately about twenty layers in some embodiments, although more or fewer layers may be used), to form many $sp^2$ carbon-carbon pi bonds typical in graphitic materials. A plasma-assisted decomposition and deposition at temperatures of about 400° C. to about 900° C., preferably below approximately 550° C. and more preferably below approximately 450° C. from a mixture of hydrogen and a carbon source such as $C_2H_2$, $C_3H_6$, etc., may be used to minimize the total temperature and time exposure of the other device layers. Several exemplary PECVD chambers are commercially available, although any suitable PECVD chamber may be used.

Such a process may be performed with or without a dilution and/or carrier gas such as helium, argon, xenon, krypton, combinations of the same and/or the like. In some embodiments, a flow rate of the hydrogen may be equal to or greater than a (molar) flow rate of the hydrocarbon precursor source. Hydrocarbon precursor gas sources may include, but are not limited to, hexane, cyclo-hexane, acetylene, single and double short chain hydrocarbons such as methane, various benzene based hydrocarbons, polycyclic aromatics, aliphatic hydrocarbons, alicyclic hydrocarbons, aromatic hydrocarbons, short chain ester, ethers, and alcohols or a combination thereof.

In some embodiments, such a hydrocarbon source and $H_2$ gas formation process may be employed to form a C-based layer such as amorphous carbon, without the use of a PECVD chamber. For example, thermal energy may be the only energy input during the C-based layer formation process. Such a process may be performed with or without a dilution and/or carrier gas such as helium, argon, xenon, krypton, combinations of the same and/or the like. In some embodiments, a flow rate of the hydrogen may be equal to or greater than a (molar) flow rate of the hydrocarbon source.

In an alternative process, to reduce the switching voltage of the carbon layer, multiple carbon depositions may be used, each depositing about a mono-layer of carbon. In some embodiments, an anneal may be performed (e.g., at less than about 600° C.) in a non-oxidizing ambient before successive deposition of the next carbon (near) mono-layer. For example, the C-based switching material 114 may be formed from at least two and less than approximately twenty layers before adding the C-based interface layer 116. (See, for example, U.S. Provisional Patent Application Ser. No. 61/044,399, filed Apr. 11, 2008 and title "THIN DEPOSITED CARBON SWITCHABLE RESISTOR AND DIODE MATRIX CELL FOR 3D ARRAYS" (Docket No. 257P), which is hereby incorporated by reference herein in its entirety for all purposes.)

An anneal step may form additional in-plane carbon bonds (e.g., $sp^2$ bonds) and limit the number of out-of-plane carbon bonds. Insofar as $sp^2$ is more conductive than $sp^3$, increasing the proportion of $sp^2$ by annealing the structure thereby decreases the resistance of the vertical conduction path. In a preferred embodiment, the C-based switching material 114 is compatible with the selection device current and voltage capability. In some embodiments, the total thickness of the C-based switching layer 114 may be in the range of approximately one Angstrom to approximately 1000 Angstroms. However, in other embodiments, the total thickness of the C-based switching layer 114 may be between approximately 600 Angstroms and approximately 800 Angstroms. Other thickness ranges may be used.

As stated previously, there are primarily two different bond structures of interest in the above-described carbon films, namely $sp^2$ and $sp^3$. The $sp^3$ bond resembles a diamond-like structure which has a tetrahedral shape while the $sp^2$ bond is more planar and takes a trigonal shape. For a C-based switching material, a desired ratio of $sp^2$ (double C=C bonds) to $sp^3$ (single C—C bonds) can be determined via, e.g., Raman spectroscopy by evaluating the D and G bands.

In one embodiment of the invention, the C-based interface layer 112 and/or 116 may have an increased $sp^3$ concentration (relative to the C-based switching layer 114) to improve the adhesion between the C-based switching layer 114 and the conducting layer 110 and/or 122. As will be described in more detail below, in an embodiment employing a PECVD process to deposit amorphous Carbon as the C-based interface layers 112, 116 and/or the C-based switching layer 114, a desired (increased) $sp^3$ bond concentration in the C-based interface layers 112, 116 can be achieved by reducing process temperature and/or increasing a plasma ionization component of the PECVD process. For example, carrier gas concentration (e.g., argon, helium, xenon, krypton, or another inert gas concentration) may be increased so as to generate more ionic species. Additionally or alternatively, a substrate bias and/or low frequency RF may be employed to increase ion bombardment. High frequency RF power may also be increased.

In general, deposition methods for the C-based interface layers 112, 116 and the C-based switching layer 114 may include, but are not limited to, sputter deposition from a target, PECVD, CVD, arch discharge techniques, laser ablation, etc. Although the deposition temperatures used are preferably below approximately 600° C., they may range from approximately 300° C. to approximately 900° C. in some embodiments. Precursor gas sources ay include, but are not limited to, hexane, cyclo-hexane, acetylene, single and double short chain hydrocarbons such as methane, various benzene based hydrocarbons, polycyclic aromatics, aliphatic hydrocarbons, alicyclic hydrocarbons, aromatic hydrocarbons, short chain ester, ethers, and alcohols or a combination thereof. When carbon nanotubes are employed for the C-based switching element, a spin on process, seeded growth, or the like may be used to form the C-based switching layer 114.

Two examples of a PECVD process for forming a C-based interface layer, including but not limited to applications for improved adhesion or as a sealing or capping layer, are described below.

Exemplary C-Based Interface Layer Formation Processes

In a first example, an amorphous C-based interface layer may be produced in accordance with the invention by a first PECVD process. Any suitable PECVD chamber may be employed. In one exemplary embodiment, a C-based interface layer formed using a $C_2H_2$ or $C_3H_6$ source gas flow rate of about 50 to about 100 sccm, a helium carrier/dilutant gas flow rate of about 2500 to about 5000 sccm, an RF power of about 150 to about 250 Watts, a chamber pressure of about 5 to about 7 Torr, a process temperature of about 550° C. and an electrode spacing of about 300 to about 400 mils produced a conducting amorphous carbon film with strong interface adhesion properties to a conducting film such as TiN, WN or W. The deposition rate of the above film in this example was about 1 Angstrom/sec. Approximately 2 nanometer nanocrystallites in the carbon film were detected by Raman spectra.

An exemplary process window for a C-based interface layer in accordance with the present invention includes:

(a) carrier (dilutant) gas to source gas ratio of about 1:1 to about 100:1, and more preferably about 5:1 to about 50:1;

(b) a high frequency RF power of about 30 to about 1000 Watts, and more preferably about 30 to about 250 Watts at a frequency of about 13.5 Mhz;

(c) an RF power density of about 0.45 to about 20 Watts/$in^2$, and more preferably about 0.45 to about 5 Watts/$in^2$;

(c) a low frequency RF power of about 0 to about 500 Watts, and more preferably about 0 to about 150 Watts at a frequency of about 90 Khz;

(c) a chamber pressure of about 1 to about 10 Torr, and more preferably about 2.5 to about 7 Torr;

(d) an electrode spacing of about 200 to about 1000 mils, and more preferably about 200 to about 500 mils; and/or (e) a process temperature of about 300° C. to about 600° C., and more preferably about 300° C. to about 550° C. In other embodiments, a process temperature of about 400° C. to about 900° C. may be used.

Note that other suitable carrier gas/source gas ratios, RF powers, chamber pressures, electrode spacings and/or process temperature may be used. Any $C_xH_y$ precursor, or other suitable precursor, may be used with any carrier/dilution gas such as $H_2$, He, Ar, Xe, Kr, etc. Increasing the carrier/dilution gas flow relative to source/precursor gas flow reduces deposition rate of the C-based interface layer and increases surface ion bombardment during film formation, both increasing the density of the C-based interface layer (e.g., relative to a C-based switching layer). Film adhesion thereby is improved.

Exemplary C-based interface layer deposition rates are about 33 angstroms/second or less, more preferably about 5 angstroms/second or less and more preferably about 1 to about 2 angstroms/second. Exemplary C-based interface layer thicknesses are about 1000 angstroms or less, and more preferably about 500 angstroms or less. In some embodiments, a C-based interface layer may have a density of about 1.2 g/cc to about 3.5 g/cc. Other deposition rates, film thicknesses and/or film densities may be used.

In a second example, an amorphous C-based interface layer may be produced in accordance with the invention by a nitridization process. In some embodiments, a carbon-based interface layer with improved adhesion may be formed using plasma nitridization in a PECVD chamber. For example, the C-based switching element 114 itself may be nitridized, or another C-based material layer may be nitridized to form a C-based interface layer.

A PECVD process may be performed with the following process conditions:

(a) an $N_2$ flow rate of about 1000 to about 20,000 sccm, and more preferably about 12,000 to about 18,000 sccm;

(b) a high frequency RF power of about 40 Watts to about 1000 Watts, and more preferably about 40 Watts to about 250 Watts;

(c) a chamber pressure of about 1 to about 10 Torr, and more preferably about 3 Torr to about 7 Torr;

(d) an electrode spacing of about 200 to about 1000 mils, and more preferably about 250 to about 600 mils; and/or (e) a process temperature of about 300° C. to about 600° C.

Note that other suitable gas flow rates, RF powers, chamber pressures, electrode spacings and/or process temperatures may be used. Other nitridizing processes may be employed, such as exposing a C-based material layer to NH$_3$, N$_2$O or the like at an elevated temperature and/or any other nitrogen gas source.

Although FIG. 1 illustrates an example of a C-based switching apparatus employing C-based interface layers in accordance with the present invention, those skilled in the art will appreciate that the inventive C-based interface layers may be implemented in a variety of devices and applications, such as for capping or sealing layers. For example, a deposited or grown CNT material layer typically has a rough surface topography, with pronounced thickness variations, such as numerous peaks and valleys. Such a CNT layer may also be very porous, so much so that depositing a conductive metal layer directly on the CNT layer may create a short circuit through the entire CNT layer (e.g., due to migration of metal atoms through the CNT film due to thermal processing during device fabrication).

To overcome such potential issues, in one or more embodiments of the invention, a C-based interface layer may be formed over a porous C-based switching material to cap the porous C-based switching material prior to formation of a conductive layer over the C-based switching material. Such a C-based interface layer may also improve adhesion between the C-based switching material and conductive layer. Any of the previously described C-based interface layers may serve as such a capping layer.

Additional Embodiments

Figure 2:
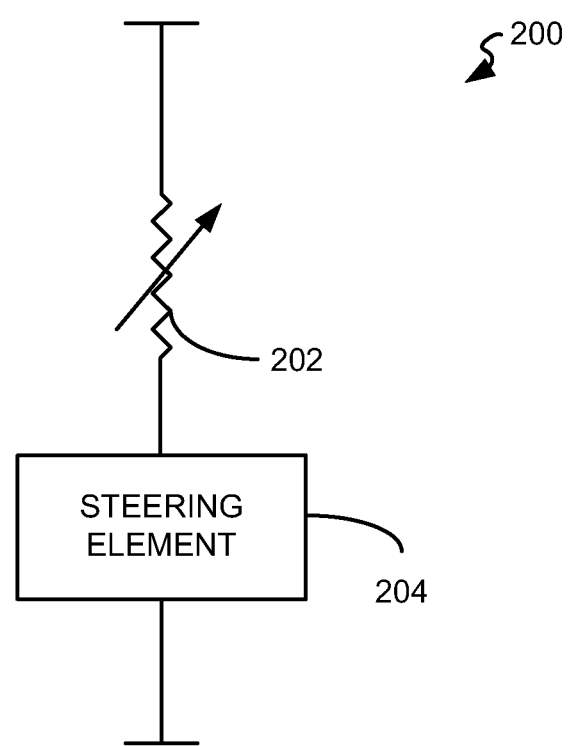
FIG. 2 depicts a memory cell in accordance with the present invention.

FIG. 2 is a schematic illustration of an exemplary memory cell 200 in accordance with the present invention. The memory cell 200 includes a C-based, reversible resistance-switching element 202 coupled to a steering element 204. For example, a C-based resistivity switching element 202, such as MIM stack 111 in FIG. 1, may be placed in series with a steering element 204, such as diode 108, to form memory cell 200. The steering element 204 may include a thin film transistor, a diode, or another suitable steering element that exhibits non-ohmic conduction by selectively limiting the voltage across and/or the current flow through the reversible resistance-switching element 202.

The reversible resistance-switching element 202 includes a reversible resistivity-switching material (not separately shown) having a resistance that may be reversibly switched between two or more states. For example, the reversible resistivity-switching material of the element 202 may be in an initial, low-resistivity state upon fabrication that is switchable to a high-resistivity state upon application of a first voltage and/or current. Application of a second voltage and/or current may return the reversible resistivity-switching material to a low-resistivity state. Alternatively, the reversible resistance-switching element 202 may be in an initial, high-resistance state upon fabrication that is reversibly switchable to a low-resistance state upon application of the appropriate voltage(s) and/or current(s). When used in a memory cell, one resistance state may represent a binary "0" while another resistance state may represent a binary "1", although more than two data/resistance states may be used. In some embodiments, the reversible resistivity-switching material may be a C-based switching film (as previously described).

Figure 3:
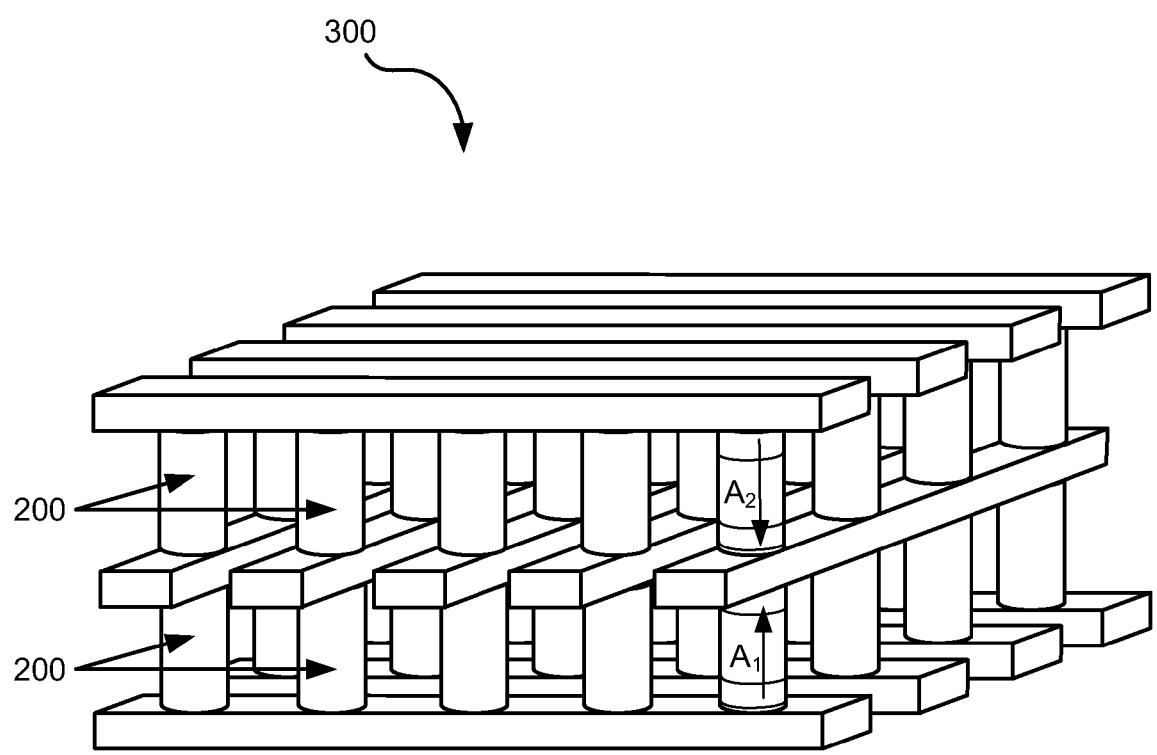
FIG. 3 depicts a perspective view of an example of an array of memory cells in accordance with the present invention.

FIG. 3 depicts an exemplary three dimensional memory array 300 having numerous memory cells 200 on multiple memory levels. By using the steering element 204 to selectively limit the voltage across and/or the current flow through the reversible resistance-switching element 202, the memory cells 200 may be used as part of a two or three dimensional memory array. Data may be written to and/or read from a memory cell 200 without affecting the state of other memory cells in an array as illustrated in FIG. 3. Interconnects may be fabricated to connect each memory cell (e.g., a steering element in series with a C-based switching material) to R/W circuitry.

Exemplary methods of forming such memory levels are described, for example, in U.S. Pat. No. 6,952,030, "High-density three-dimensional memory cell" and/or U.S. patent application Ser. No. 11/692,151, filed Mar. 27, 2007 and titled "LARGE ARRAY OF UPWARD POINTING P-I-N DIODES HAVING LARGE AND UNIFORM CURRENT", each of which is hereby incorporated by reference herein in its entirety for all purposes.

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167. The substrates may be thinned or removed from the memory levels before bonding, but as the memory levels are initially formed over separate substrates, such memories are not true monolithic three dimensional memory arrays.

As stated, memory cell operation is based on a bi-stable resistivity change in the C-based material with the application of high bias voltage (>4 V). Current through the memory cell may be modulated by the resistivity of the C-based material. The memory cells are read at a lower voltage that will not change the resistivity of the C-based material. In some embodiments, the difference in resistivities between the two states may be over 100x, as described in U.S. Pat. No. 6,706,402, and others. The cell may be changed from a "0" to a "1" with the application of high forward bias on the steering element. The cell may be changed back from a "1" to a "0" with the application of a high forward bias.

Figure 4:
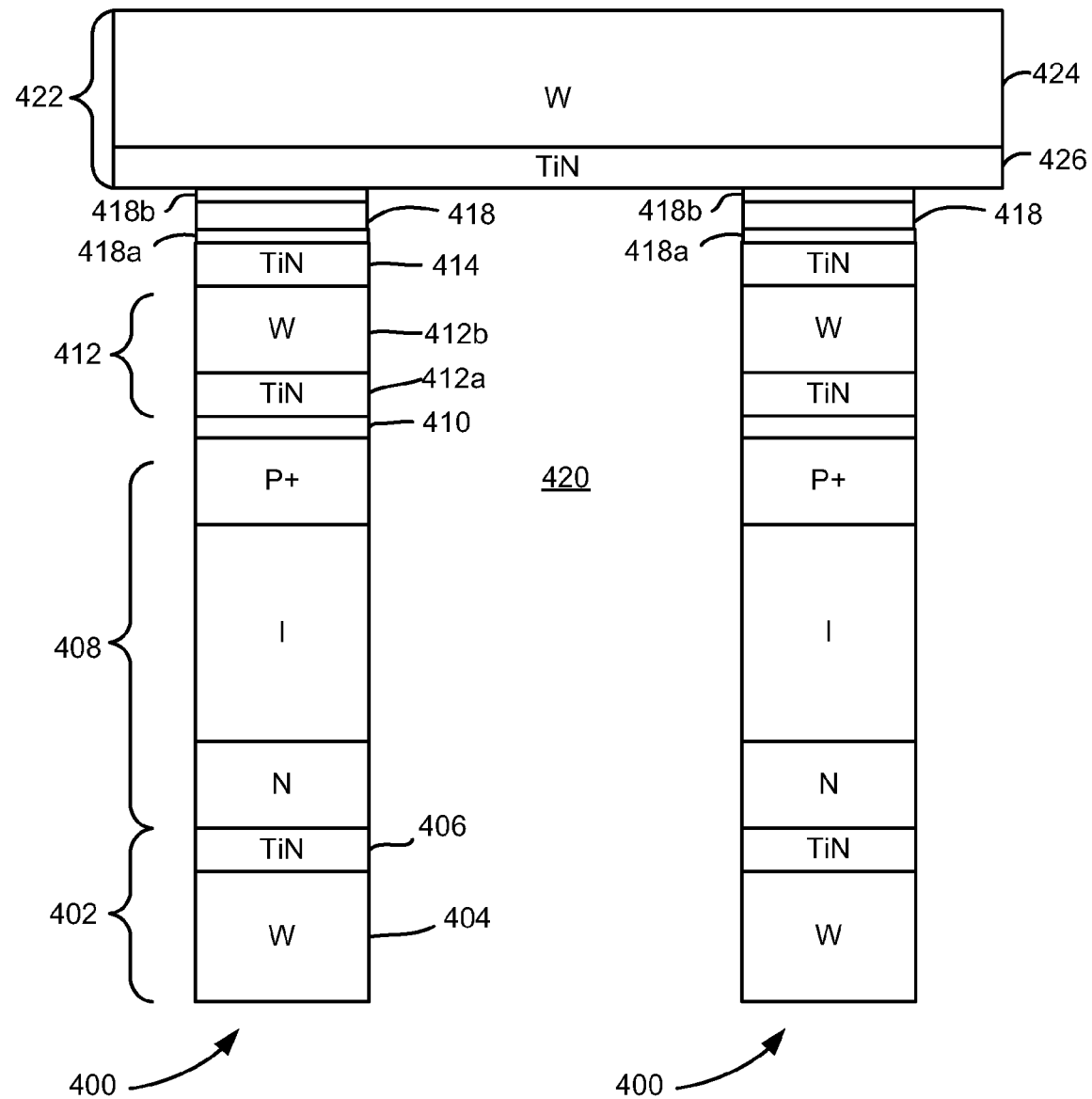
FIG. 4 is a cross-sectional side elevational view of a plurality of exemplary memory cells formed in accordance with the present invention.

FIG. 4 is a cross-sectional view of a plurality of exemplary memory cells 400 formed in accordance with the present invention. With reference to FIG. 4, a first rail conductor 402 is formed above a substrate (not shown). For example, the first conductor 402 may include a tungsten layer or other conductive layer 404 with or without a TiN, TaN, WN, Mo or other adhesion/barrier layer 406. A vertical P-I-N (or N-I-P) diode 408, such as a deposited polysilicon or other polycrystalline semiconductor diode, is formed above first conductor 402, as is a silicide region 410 and a metal hard mask 412.

Silicide region 410 is formed from a silicide-forming metal, such as titanium or cobalt, as described in U.S. Pat. No. 7,176,064, previously incorporated by reference herein in its entirety. In some embodiments, the silicide layer 410 enhances the crystalline structure of the diode 408 during annealing, providing lower resistivity silicon. Similar results may be achieved for silicon-germanium alloy and/or germanium diodes. Metal hard masks are described, for example, in the '936 Application, previously incorporated by reference herein in its entirety. The metal hard mask 412 may include, for example, a barrier layer 412a such as TiN, TaN, WN, Mo, etc., and/or conductive layer 412b such as W or another conductive layer, and may serve as a hard mask during formation of the diode 408.

A TiN, TaN, WN, Mo or other adhesion/barrier layer 414 is formed above the metal hard mask 412. A C-based switching film 418 (with top and/or bottom C-based interface layers 418a, 418b) is formed above the adhesion/barrier layer 414. The interface layers 418a, 418b may include regions of the C-based switching film 418 or another C-based material with increased sp³ bond density and/or increased film density, a nitridized region of the C-based switching film 418 or another C-based material, or the like as previously described.

Thereafter, a top conductor 422 is formed above the C-based switching film 418. For example, the top conductor 422 may include a tungsten layer or other conductive layer 424 with or without a TiN, TaN, WN, Mo or other adhesion/barrier layer 426. In some embodiments, the C-based switching film 418 may be positioned below the diode 408.

In some embodiments, the barrier layer 414, hard mask 412 and diode 408 may be etched together to form pillar structures, and dielectric material 420 may be deposited on top of and around the pillar structures so as to isolate the pillar structures from one another. A CMP or dielectric etchback step then is performed to planarize the dielectric material 420 and remove the dielectric material from the top of the barrier layer 414. Thereafter, the C-based switching film 418 and/or interface layers 418a, 418b may be deposited, patterned and etched. Insulating material 420 may be subsequently deposited around the etched layers 418, 418a, 418b and planarized by an etch back process, chemical mechanical polishing (CMP) or the like. In an alternative embodiment, the C-based switching film 418 and/or interface layers 418a, 418b may be deposited before the barrier layer 414, hard mask 412 and diode 408 are patterned and etched. In this manner, the layers 418, 418a, 418b may be patterned and etched with the barrier layer 414, hard mask 412 and diode 408. Dielectric material 420 then may be deposited on top of and around the resulting pillar structures so as to isolate the pillar structures from one another. A CMP or dielectric etchback step then is performed to planarize the dielectric material 420 and remove the dielectric material from the top of the C-based switching film 418 (and/or the interface layer 418b).

In some embodiments of the invention, prior to forming a C-based switching layer and/or a C-based interface layer over a conducting layer such as TaN, TiN, WN, or the like, a surface of the conducting layer may be pre-treated to improve adhesion between the C-based switching layer (and/or the C-based interface layer if used) and the conducting layer. For example, the surface of the conducting layer may be exposed to a gas plasma to treat the surface of the conducting layer prior to C-based material formation. In at least one embodiment, a gas plasma generated under the same conditions used to form the C-based interface and/or switching layer, but without the carbon precursor source, may be employed to pre-treat a surface of a conducting layer. For example, the same carrier gas, such as He, Ar, H₂, N₂, Xe, Kr, etc., used during formation of the C-based material may be used in the pre-treating gas plasma (e.g., with the same flow rate, chamber pressure, RF power, electrode spacing and/or processing temperature). In some embodiments, a pre-treatment may include exposing the surface of a conducting layer to a gas plasma for about 5 to 20 seconds, although longer or shorter times may be used. To avoid plasma instability, the carbon precursor(s) used to form the C-based material may be added immediately after pre-treatment (e.g., without interrupting the plasma). In other embodiments, one or more of the processing parameters used during C-based material formation may be varied during pre-treatment of the conducting surface.

In one or more embodiments, a thermal anneal may be performed after a C-based material (e.g., a C-based interface layer and/or a C-based switching layer) is formed over or under a conducting layer (e.g., TiN, TaN, etc.) to improve adhesion between the C-based material and the conducting layer. An exemplary thermal anneal may be performed in He, Ar, N₂, Kr, Xe or another inert gas for about 20-35 minutes at a temperature of about 300-600° C. In some embodiments, the same PECVD chamber used to form a C-based interface layer and/or a C-based switching layer over a conducting layer may be used to perform the anneal. In one particular example, an annealing gas flow rate of about 1000 sccm or greater, a chamber pressure of about 2 Torr or greater, an electrode spacing of about 350-600 mils and an anneal temperature of about 300-550° C. may be used for about 30 minutes. Other flow rates, chamber pressures, electrodes spacing and/or temperatures may be used. Also, annealing may be performed in a different chamber such as an annealing furnace.

While the foregoing is directed to exemplary embodiments of the present invention, other and further embodiments will be readily apparent to those of ordinary skill in the art without departing from the scope of the invention. Accordingly, while the present invention has been disclosed in connection with exemplary embodiments thereof, it should be understood that other embodiments may fall within the spirit and scope of the invention, as defined by the following claims.

The invention claimed is:

1. A memory cell comprising:
   a first conductor;
   a metal-insulator-metal (MIM) stack formed above the first conductor, the MIM stack including:
      a bottom electrode;
      a first carbon-based interface layer disposed on the bottom electrode;
      a carbon-based resistivity switching material comprising carbon nanotubes formed on the first carbon-based interface layer;
      a second carbon-based interface layer disposed on the carbon-based resistivity switching material; and
      a top electrode disposed on the second carbon-based interface layer;
   a steering element formed above the first conductor; and
   a second conductor formed above the MIM stack and the steering element.

2. The memory cell of claim 1, wherein the first carbon-based interface layer and/or the second carbon-based interface layer has an sp³ bond concentration greater than that of the carbon-based resistivity switching material.

3. The memory cell of claim 1, wherein the first carbon-based interface layer and/or the second carbon-based interface layer has a density greater than that of the carbon-based resistivity switching material.

4. The memory cell of claim 1, wherein the first carbon-based interface layer and/or the second carbon-based interface layer comprises nitridized carbon-based material.

5. The memory cell of claim 1, wherein the first carbon-based interface layer and/or the second carbon-based interface layer has a thickness of about 500 angstroms or less.

6. The memory cell of claim 1, wherein the first carbon-based interface layer and/or the second carbon-based interface layer comprises amorphous carbon.

7. The memory cell of claim 1, wherein one or more of the first carbon-based interface layer and/or the second carbon-based interface layer and the carbon-based resistivity switching material comprises one or more of amorphous carbon containing graphene, graphene, and carbon nanotubes.

8. The memory cell of claim 1 wherein the steering element comprises a vertical diode.

* * * * *